United States Patent
Ma et al.

(10) Patent No.: US 9,004,876 B2
(45) Date of Patent: Apr. 14, 2015

(54) COOLING SYSTEM AND CONTROL METHOD

(71) Applicants: Hong Fu Jin Precision Industry (ShenZhen) Co., Ltd., Shenzhen (CN); Hon Hai Precision Industry Co., Ltd., New Taipei (TW)

(72) Inventors: Zhen-Xing Ma, Shenzhen (CN); Lei Liu, Shenzhen (CN)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 236 days.

(21) Appl. No.: 13/684,626

(22) Filed: Nov. 26, 2012

(65) Prior Publication Data

US 2013/0171006 A1    Jul. 4, 2013

(30) Foreign Application Priority Data

Dec. 28, 2011   (CN) .......................... 2011 1 0447332

(51) Int. Cl.
| F04B 49/06 | (2006.01) |
| F04B 41/06 | (2006.01) |
| H05K 7/20  | (2006.01) |
| G11B 33/14 | (2006.01) |

(52) U.S. Cl.
CPC ........ *H05K 7/20209* (2013.01); *H05K 7/20136* (2013.01); *H05K 7/20836* (2013.01); *G11B 33/142* (2013.01)

(58) Field of Classification Search
CPC .......... H05K 7/20209; H05K 7/20836; H05K 7/20136; G11B 33/142
USPC ...................... 417/6, 426; 361/695
See application file for complete search history.

(56) References Cited

U.S. PATENT DOCUMENTS

| 6,042,348 A | * | 3/2000 | Aakalu et al. | 417/423.5 |
| 6,362,960 B1 | * | 3/2002 | Ducourt et al. | 361/695 |
| 6,991,533 B2 | * | 1/2006 | Tsai et al. | 454/184 |
| 7,866,959 B2 | * | 1/2011 | Barsun et al. | 417/423.5 |
| 2005/0095138 A1 | * | 5/2005 | Robertson et al. | 417/16 |

* cited by examiner

*Primary Examiner* — Charles Freay
(74) *Attorney, Agent, or Firm* — Novak Druce Connolly Bove + Quigg LLP

(57) ABSTRACT

A cooling system includes a fan group with a number of fans arranged in a row, a rail extending in a direction parallel to the row of the fans. A backup fan slidably mounted to the rail, a motor configured to control the movement of the backup fan, and a control board to determine whether there exists one malfunction fan in the fan group. When one abnormal fan exists in the fan group, the control board outputs a control signal to the motor, to enable the motor to drive the backup fan to move to a location corresponding to the abnormal fan.

10 Claims, 5 Drawing Sheets

COOLING SYSTEM AND CONTROL METHOD

BACKGROUND

1. Technical Field

The present disclosure relates to a cooling system and a control method for the cooling system.

2. Description of Related Art

A server may include a plurality of hard disk drives (HDDs). The heat generated by the HDDs may be dissipated by a plurality of fans defined in one group. However, if one of the fans is malfunctioning, and is not replaced with a normal fan immediately, the other fans may not effectively dissipate the heat. Consequently, the server may be unstable.

Therefore, there is room for improvement in the art.

BRIEF DESCRIPTION OF THE DRAWINGS

Many aspects of the present disclosure can be better understood with reference to the following drawing(s). The components in the drawing(s) are not necessarily drawn to scale, the emphasis instead being placed upon clearly illustrating the principles of the present disclosure. Moreover, in the drawing(s), like reference numerals designate corresponding parts throughout the several views.

DETAILED DESCRIPTION

Figure 1:
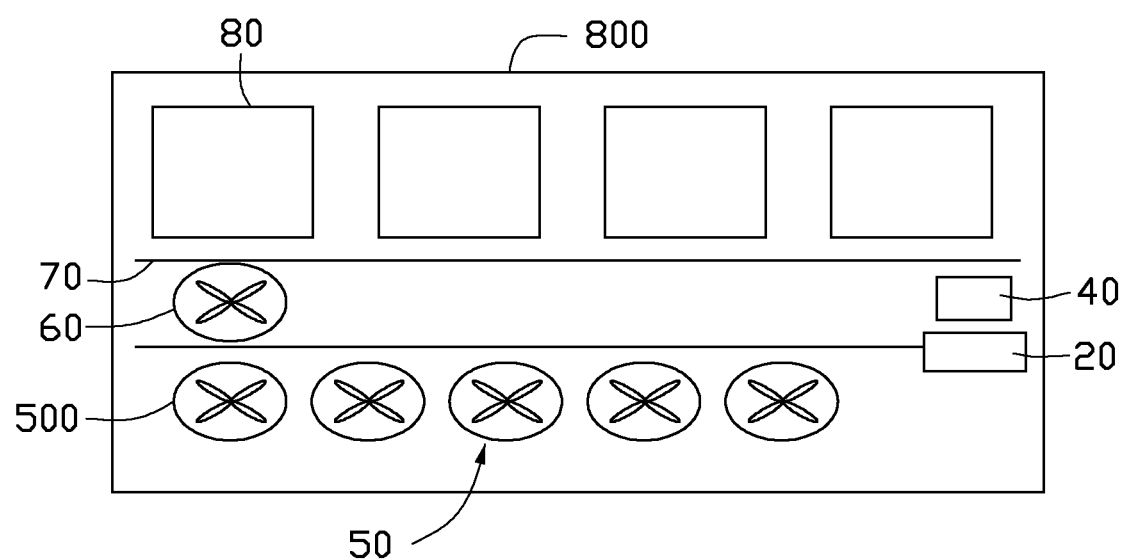
FIG. 1 is a schematic diagram of an embodiment of a cooling system of the present disclosure.
Figure 2:
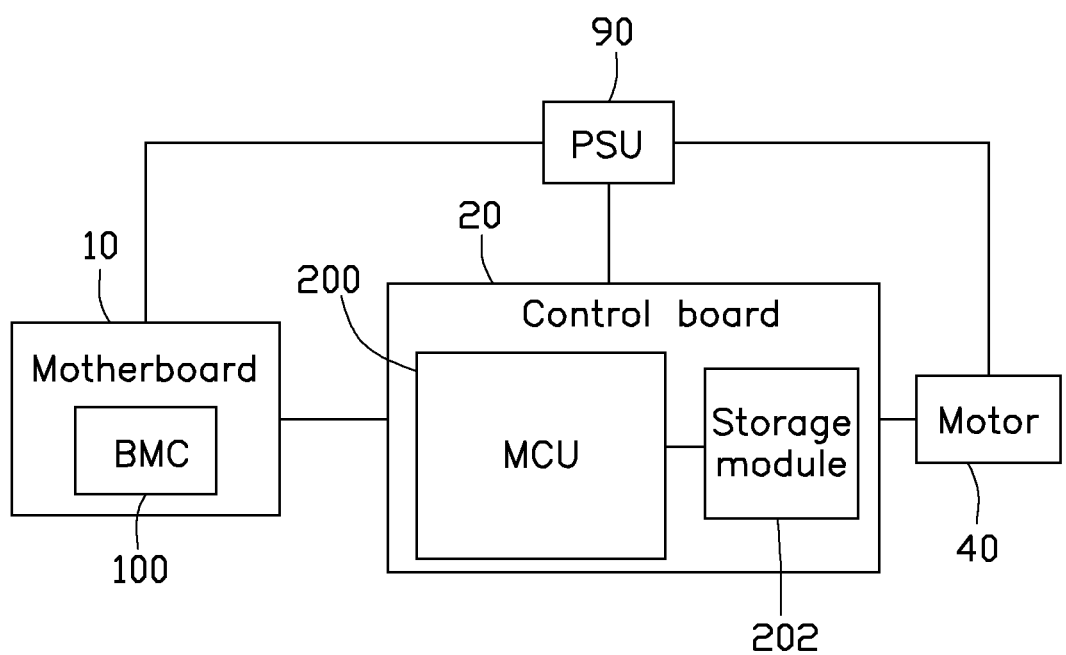
FIG. 2 is a block diagram of the cooling system of FIG. 1, wherein the cooling system includes a micro control unit.

FIGS. 1 and 2 illustrate an embodiment of a cooling system of the present disclosure. The cooling system is configured to dissipate heat generated by a plurality of hard disk drives (HDDs) 80 arranged in a server 800. The server 800 includes a motherboard 10. A power supply unit (PSU) 90 powers the motherboard 10 and the HDDs 80. The cooling system includes a control board 20, a fan group 50, a baseboard management controller (BMC) 100 arranged on the motherboard 10, a rail 70, a backup fan 60 slidably mounted to the rail 70, and a motor 40.

In the embodiment, the fan group 50 includes a plurality of fans 500 that is placed in a row adjacent to the HDDs 80, to dissipate heat generated by the HDDs 80. The rail 70 extends in a direction parallel to the row of fans 500, and the length of the rail 70 is the same with the length of the row of fans 500. The motor 40 is arranged at one end of the rail 70. The backup fan 60 can be moved along the rail 70 by the motor 40. The control board 20 is configured to position the backup fan 60 to a location through the motor 40, thereby to replace a malfunction fan 500 in the fan group 50.

The BMC 100 is used to control speeds of the fans 500 and the backup fan 60. For example, the BMC 100 outputs a pulse signal with a certain duty cycle to the fans 500 and the backup fan 60, to control the speeds of the fans 500 and the backup fan 60. The BMC 100 is also used to obtain the speeds of the fans 500, to determine whether there exists at least one abnormal fan 500 in the fan group 50. In the embodiment, if the speed of one fan 500 is "0", it indicates that the fan 500 is abnormal.

The BMC 100 is also used to assign numbers to the fans 500 in the fan group 50, thereby to find the abnormal fan 500 according to the number.

The control board 20 includes a micro control unit (MCU) 200 and a storage module 202. The storage module 202 stores the location corresponding to each fan 500 in the fan group 50, such as a first fan 500 corresponding to a first location, a second fan 500 corresponding to a second location, a third fan 500 corresponding to a third location, and a fourth fan 500 corresponding to a fourth location.

Figure 3:
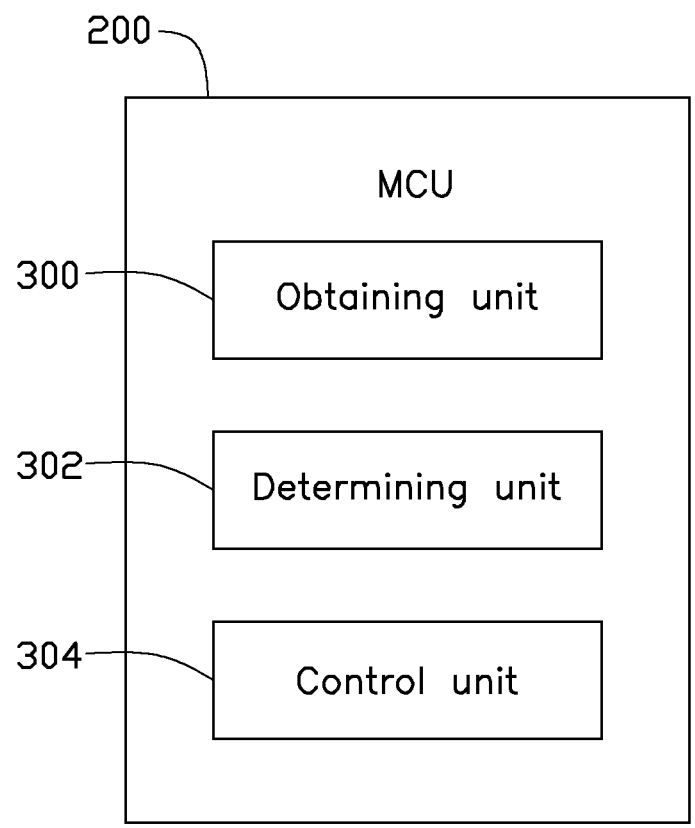
FIG. 3 is block diagram of the micro control unit of FIG. 2.

FIG. 3 illustrates the MCU 200 includes an obtaining unit 300, a determining unit 302, and a control unit 304.

The obtaining unit 300 is utilized to obtain status information and the number of the fans 500 in the fan group 50. For example, the obtaining unit 300 obtains the speed of the first fan 500, and the speed of the second fan 500.

The determining unit 302 determines whether the fans 500 in the fan group 50 are normal or not. For example, the determining unit 302 determines whether the speed of the fan 500 is "0". If the speed of the fan 500 is "0", it indicates that the fan 500 in the fan group 50 is abnormal. In that case, the determining unit 302 sends a determining signal including the number corresponding to the abnormal fan 500 to the control unit 304.

The control unit 304 obtains a location according to the number corresponding to the determining signal from the storage module 202, and outputs a control signal corresponding to the location to the motor 40, to enable the motor 40 to drive the backup fan 60 to move to the location of the abnormal fan 500. In the meanwhile, the control unit 304 outputs a startup signal to the BMC 100, to enable the BMC 100 to output a pulse signal to the backup fan 60. The backup fan 60 operates, thereby to replace the abnormal fan 500.

Figure 4:
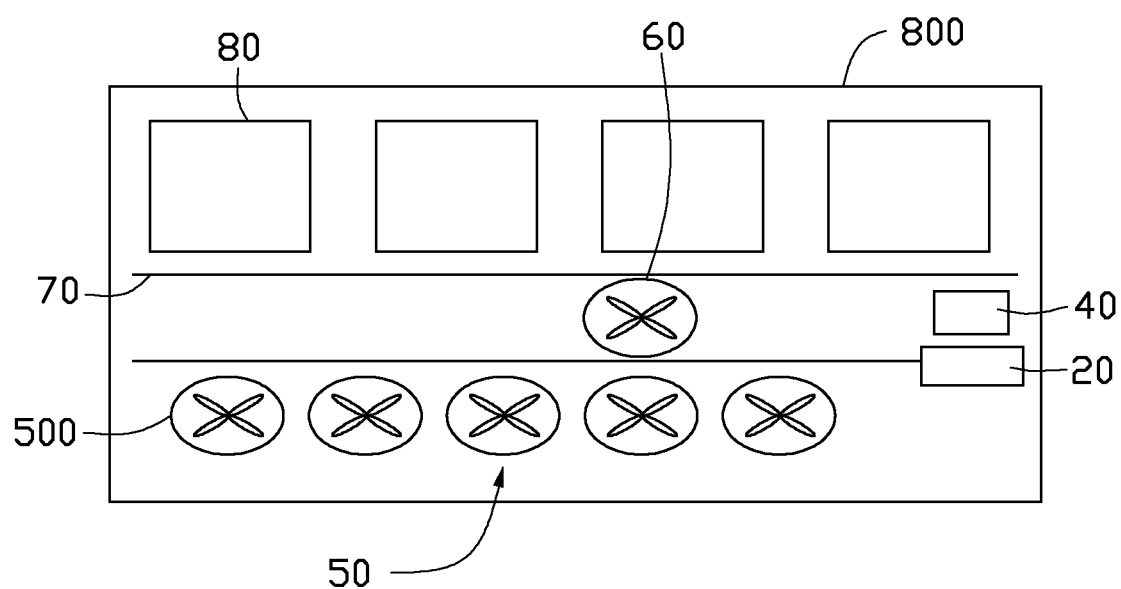
FIG. 4 is similar to FIG. 1, but showing a using state of the cooling system.

FIG. 4 illustrates a state of use of the cooling system of the present disclosure. The obtaining unit 300 obtains the status information of the fans 500 in the fan group 50. For example, if a fourth fan 500 is abnormal. The obtaining unit 300 receives the speed of the fourth fan of the fan group 50 being "0". The determining unit 302 determines that the speed of the fourth fan is "0", and outputs the number of the abnormal fan 500 to the control unit 304, that is the fourth number. The control unit 304 obtains the location corresponding to the fourth number from the storage module 202, which is the fourth location. The control unit 304 outputs the control signal corresponding to the fourth location to the motor 40. The motor 40 drives the backup fan 60 to move to the fourth location. At that time, the control unit 304 outputs a startup signal to the BMC 100, to enable the BMC 100 to output a pulse signal to the backup fan 60. The backup fan 60 operates.

Figure 5:
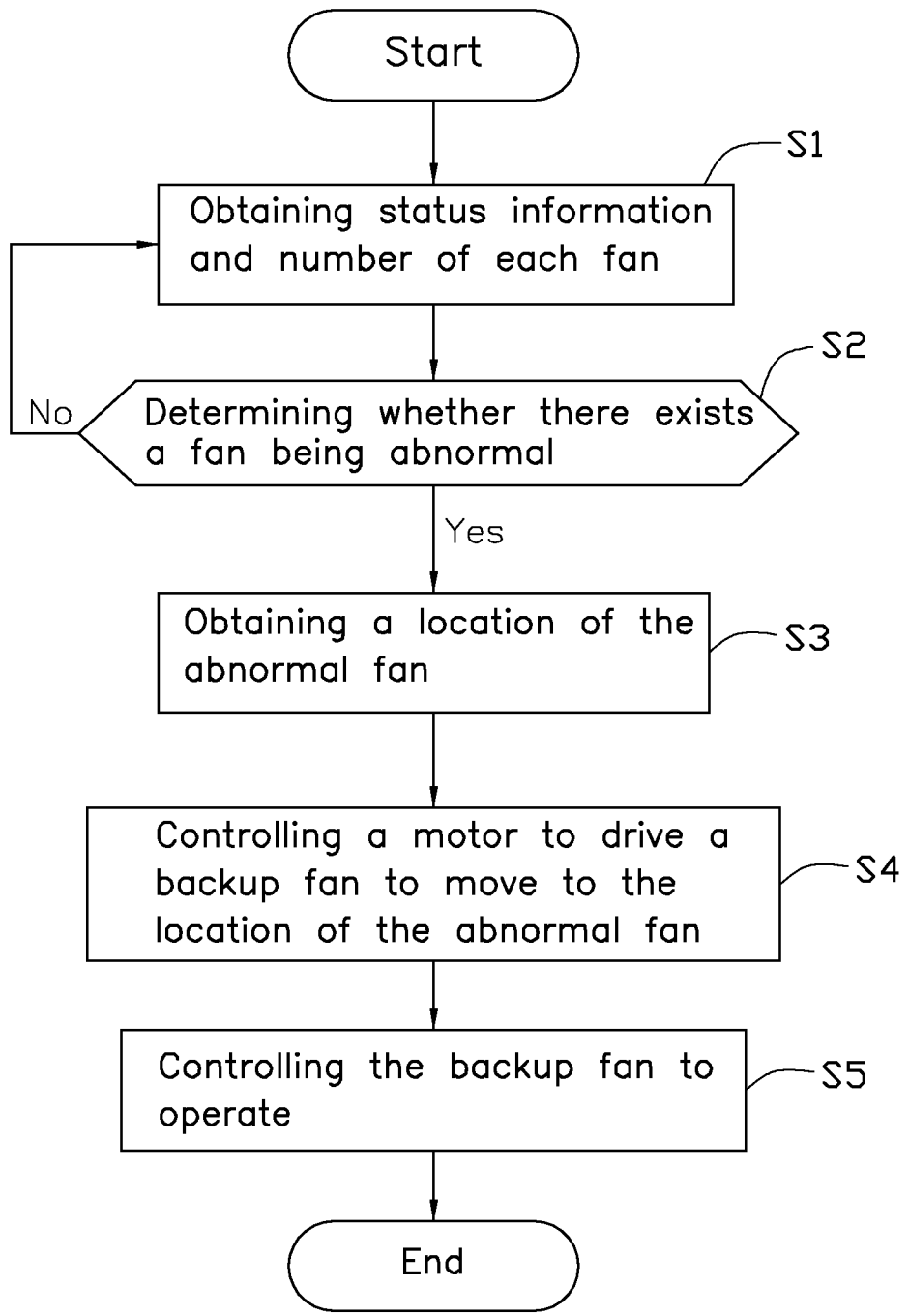
FIG. 5 is a flow chart of an embodiment of a control method of the present disclosure.

FIG. 5 illustrates a control method of the present disclosure. The control method includes steps shown below.

In step S1, the obtaining unit 300 obtains status information and the number of each fan. In the embodiment, the obtaining unit 300 obtains the speeds and numbers of the fans 500 in the fan group 50.

In step S2, the determining unit 302 determines whether there exists one abnormal fan 500 in the fan group 50. If one abnormal fan 500 exists in the group, step S3 is implemented, otherwise, the process returns to the step S1. In the embodiment, the determining unit 302 determines whether the speed of the fan 500 is "0". If the speed of the fan 500 is "0", it indicates that the fan 500 is abnormal.

In step S3, the control unit 304 obtains a location corresponding to the abnormal fan 500. In the embodiment, the control unit 304 obtains the location from the storage module 202 according to the number of the abnormal fan 500. In the embodiment, the storage module 202 stores the location corresponding to each fan 500 in the fan group 50, so that the control unit 304 obtains the location corresponding to the abnormal fan 500 from the storage module 202.

In step S4, the control unit 304 outputs a control signal to the motor 40, thereby controlling the motor 50 to drive the backup fan 60 to move to the location corresponding to the abnormal fan 500.

In step S5, the control unit 304 outputs a startup signal to the BMC 100, to enable the BMC 10 to output a pulse signal to the backup fan 60, thereby to enable the backup fan 60 to operate.

While the disclosure has been described by way of example and in terms of preferred embodiment, it is to be understood that the disclosure is not limited thereto. To the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A cooling system, comprising:
a fan group comprising a plurality of fans arranged in a row;
a rail extending in a direction parallel to the row of the fans;
a backup fan slidably mounted to the rail;
a motor configured to control the movement of the backup fan; and
a control board to determine whether there exists at least one malfunction fan in the fan group;
wherein when at least one fan in the fan group is abnormal, the control board outputs a control signal to the motor, to enable the motor to drive the backup fan to move to a location corresponding to the abnormal fan.

2. The cooling system of claim 1, further comprising a baseboard management system (BMC), wherein the BMC assigns numbers to each of the fans in the fan group, the BMC outputs a pulse signal to the backup fan, to enable the backup fan to operate.

3. The cooling system of claim 2, wherein the control board comprises a micro control unit and a storage module, the storage module stores location corresponding to the number of each fan in the fan group, the micro control unit comprises:
an obtaining unit configured to obtain status information and the number of each fan in the fan group;
a determining unit configured to determine whether there exists at least one abnormal fan in the fan group, and output a determining signal in response to there being at least one abnormal fan; and
a control unit configured to receive the determining signal, and obtain the location corresponding to the abnormal fan according to the determining signal from the storage module, output the control signal to the motor to drive the backup fan to move to the location corresponding to the abnormal fan, and output a startup signal to the BMC, to enable the BMC to control the backup fan to operate.

4. The cooling system of claim 3, wherein the determine signal comprises the number of the abnormal fan.

5. The cooling system of claim 3, wherein the determining signal comprises a speed of each fan.

6. The cooling system of claim 5, wherein the fan is abnormal in response to the speed of the fan being "0".

7. A control method for a plurality of fans in a fan group and a backup fan, wherein the backup fan is slidably mounted to a rail by a motor, the control method comprising:
obtaining status information and a number of each fan in the fan group;
determining whether there exists at least one malfunction fan in the fan group according to the status information;
outputting a determining signal in response to the existence of at least one abnormal fan;
obtaining a location corresponding to the abnormal fan according to the determining signal;
outputting a control signal to the motor to drive the backup fan to move to the location of the abnormal fan; and
outputting a startup signal to a baseboard management system (BMC), to control the backup fan to operate.

8. The control method of claim 7, wherein the status information comprises a speed of each fan.

9. The control method of claim 8, wherein the step "determining whether there exists at least one abnormal fan according to the status information" further comprises:
determining whether the speed of the fan is "0",
determining the fan is abnormal in response to the speed of the fan being "0".

10. The control method of claim 7, wherein the step "obtaining a location corresponding to the abnormal fan according to the determining signal" further comprises:
storing location corresponding to the number of each fan in the fan group; and
obtaining the location according to the number of the abnormal fan.

* * * * *